(12) United States Patent
Leffel et al.

(10) Patent No.: US 7,831,221 B2
(45) Date of Patent: Nov. 9, 2010

(54) PREDISTORTION SYSTEM AND AMPLIFIER FOR ADDRESSING GROUP DELAY MODULATION

(75) Inventors: Michael D. Leffel, Crystal Lake, IL (US); Edward V. Louis, St. Charles, IL (US)

(73) Assignee: Andrew LLC, Hickory, NC (US)

( * ) Notice: Subject to any disclaimer, the term of this patent is extended or adjusted under 35 U.S.C. 154(b) by 862 days.

(21) Appl. No.: 11/301,910

(22) Filed: Dec. 13, 2005

(65) Prior Publication Data
US 2007/0135065 A1    Jun. 14, 2007

(51) Int. Cl.
H04B 1/04    (2006.01)
(52) U.S. Cl. .............. 455/114.3; 455/114.1; 455/114.2; 375/297
(58) Field of Classification Search ................ 455/114.2
See application file for complete search history.

(56) References Cited

U.S. PATENT DOCUMENTS

| | | | |
|---|---|---|---|
| 4,335,363 A | 6/1982 | Bowers |
| 5,420,541 A | 5/1995 | Upton |
| 5,444,418 A | 8/1995 | Mitzlaff |
| 5,568,086 A | 10/1996 | Schuss |
| 5,739,723 A | 4/1998 | Sigmon |
| 5,757,229 A | 5/1998 | Mitzlaff |
| 5,786,727 A | 7/1998 | Sigmon |
| 5,880,633 A | 3/1999 | Leizerovich |
| 5,886,575 A | 3/1999 | Long |
| 5,966,059 A | 10/1999 | Sigmon |
| 6,085,074 A | 7/2000 | Cygan |
| 6,097,252 A | 8/2000 | Sigmon |
| 6,128,479 A | 10/2000 | Fitzpatrick |
| 6,133,788 A | 10/2000 | Dent |
| 6,181,199 B1 | 1/2001 | Camp, Jr. |
| 6,262,629 B1 | 7/2001 | Stengel |
| 6,320,462 B1 | 11/2001 | Alley |
| 6,320,464 B1 | 11/2001 | Suzuki |

(Continued)

FOREIGN PATENT DOCUMENTS

EP    1104093 A1    5/2001

(Continued)

OTHER PUBLICATIONS

Kelly Mekechuk, et al.; Test Instruments Coupled with EDA software maximize Doherty Amplifier Linearity and Efficiency; article; Sep. 27, 2004, EETIMES.

(Continued)

*Primary Examiner*—Yuwen Pan
*Assistant Examiner*—Ajibola Akinyemi
(74) *Attorney, Agent, or Firm*—Wood, Herron & Evans, LLP

(57) ABSTRACT

An amplifier includes an RF power amplifier and a predistortion circuit coupled to the power amplifier. The predistortion circuit affects an input path of an RF input signal to the power amplifier. The predistortion circuit is operable for detecting a level of an input signal and generating a delay in the input path based on the input signal level. This enables predistortion correction of a new distortion term AM/DM, in addition to the well known AM/AM and AM/PM terms. The new AM/DM term represents the distortion that is caused by the delay modulation of the input signal as a function of the envelope power variation within the input signal.

33 Claims, 13 Drawing Sheets

U.S. PATENT DOCUMENTS

| | | | |
|---|---|---|---|
| 6,356,149 | B1 | 3/2002 | Stengel |
| 6,374,092 | B1 | 4/2002 | Leizerovich |
| 6,388,513 | B1 | 5/2002 | Wright |
| 6,396,341 | B1 | 5/2002 | Pehlke |
| 6,469,581 | B1 | 10/2002 | Kobayashi |
| 6,472,934 | B1 | 10/2002 | Pehlke |
| 6,492,867 | B2 | 12/2002 | Bar-David |
| 6,577,199 | B2 | 6/2003 | Dent |
| 6,617,929 | B2 | 9/2003 | Kim et al. |
| 6,700,444 | B2 | 3/2004 | Pengelly |
| 6,731,168 | B2 * | 5/2004 | Hedberg et al. ............. 330/149 |
| 6,731,172 | B2 | 5/2004 | Thompson |
| 6,731,173 | B1 | 5/2004 | Thompson |
| 6,798,295 | B2 | 9/2004 | Pengelly |
| 6,853,244 | B2 | 2/2005 | Robinson |
| 6,853,245 | B2 | 2/2005 | Kim |
| 6,864,742 | B2 | 3/2005 | Kobayashi |
| 6,897,721 | B2 | 5/2005 | Hellberg |
| 7,164,316 | B2 | 1/2007 | Kim et al. |
| 7,170,345 | B2 | 1/2007 | Hongo |
| 7,268,617 | B2 | 9/2007 | Kijima |
| 7,336,725 | B2 | 2/2008 | Cova |
| 2002/0186079 | A1 | 12/2002 | Kobayashi |
| 2003/0013284 | A1 | 1/2003 | Emrick |
| 2003/0076166 | A1 | 4/2003 | Hellberg |
| 2004/0119533 | A1 | 6/2004 | Kwon |
| 2004/0174212 | A1 | 9/2004 | Kim |
| 2004/0189378 | A1 | 9/2004 | Suzuki |
| 2004/0196922 | A1 * | 10/2004 | Leffel ........................ 375/297 |
| 2004/0246048 | A1 | 12/2004 | Leyonhjelm |
| 2005/0017800 | A1 | 1/2005 | Robinson |
| 2005/0017802 | A1 | 1/2005 | Robinson |
| 2005/0134377 | A1 | 6/2005 | Dent |
| 2005/0157814 | A1 | 7/2005 | Cova |
| 2006/0097783 | A1 | 5/2006 | Okubo |

FOREIGN PATENT DOCUMENTS

| | | |
|---|---|---|
| EP | 1353439 A2 | 10/2003 |
| EP | 1536556 A2 | 6/2005 |
| WO | WO2004001958 A1 | 12/2003 |
| WO | WO2004049558 A1 | 6/2004 |
| WO | WO2005031967 A1 | 4/2005 |

OTHER PUBLICATIONS

Yu Ahao, et al., Doherty Amplifier with DSP Control to Improve Performance in CMDA Operation; article; 2003EEE; La Jolla, CA, USA.

* cited by examiner

PREDISTORTION SYSTEM AND AMPLIFIER FOR ADDRESSING GROUP DELAY MODULATION

FIELD OF THE INVENTION

This invention relates generally to RF amplifiers and, more specifically, to methods and designs for improving the linearity and efficiency of RF amplifiers.

BACKGROUND OF THE INVENTION

In the design and utilization of RF power amplifiers, such as for RF communication applications, there is a constant tension between achieving a desirable linearity in the output signal while maintaining a suitable, or at least acceptable, efficiency. Traditionally the two characteristics are often competing when considered as part of the overall design scheme. Linearity is necessary to reduce interference between adjacent signals in a communication frequency band and to maintain the amplified signals within the desired band. Linearity is also desirable to reduce distortion in the amplified signal due to intermodulation products, or intermodulation distortion (IMD) caused by the signal amplification. However, the most linear designs for RF power amplifiers are usually the most inefficient in terms of average power output compared with DC input power. Conversely, designs directed to improving efficiency characteristics often suffer from unacceptable linearity characteristics.

There have been various attempts made, and amplifier designs utilized to improve both efficiency and linearity in RF power amplifiers. For example, different predistortion techniques are frequently utilized to pre-distort an RF input signal for an amplifier to offset the inherent non-linearity of the amplifier. One particular predistortion technique is digital predistortion, which utilizes look-up tables (LUTs) to provide inputs to a vector modulator positioned in the input path to the amplifier. The LUTs are indexed by a signal reflective of the instantaneous envelope power of the input signal, and the LUT outputs are complex values (I and Q) that are applied to a vector modulator along with the input signal. Using the I/Q values, the vector modulator predistorts the input signal. The predistorted input signal is then applied to an RF power amplifier. The goal of such digital predistortion is to essentially correct the distortion created in the RF power amplifier by using predistortion of the input signal. That is, the predistortion steps at the input counteract or offset the distortion caused in the output signal by the inherent characteristics of the power amplifier so that the output of the RF power amplifier is more linear.

Predistortion has been used for a variety of different amplifier designs. However, where efficiency is to also be improved, the amplification configuration has presented unique distortion characteristics that have not been adequately addressed by current digital predistortion techniques. For example, amplifiers of a Doherty design offer improved efficiency, but present the digital predistorer circuitry with unique distortion characteristics.

In typical AB amplifier designs that utilize digital predistortion, desirable correction in the range of 10-15 dB might be achieved. The AM/AM and AM/PM distortion characteristics of an AB amplifier, for example, are relatively stable over frequency variation and over temperature variation. As such, known predistortion technique have been successfully used to improve linearity in such an amplifier design.

However, the AM/AM and AM/PM distortion curves for a Doherty type amplifier are considerably different as a function of frequency. While the AM/AM curves are somewhat consistent over an operating band, such as a PCS band, the AM/PM curves are not. That is, there is an AM/PM variation over frequency, and envelope power for such a power amplifier design.

Therefore, there is a need to address the unique predistortion parameter associated with operation of a Doherty-type amplifier. There is further a need to improve efficiency in an RF power amplifier design while maintaining desirable linearity characteristics. These objectives and others are noted further herein and are addressed by the present invention.

DETAILED DESCRIPTION

Figure 1:
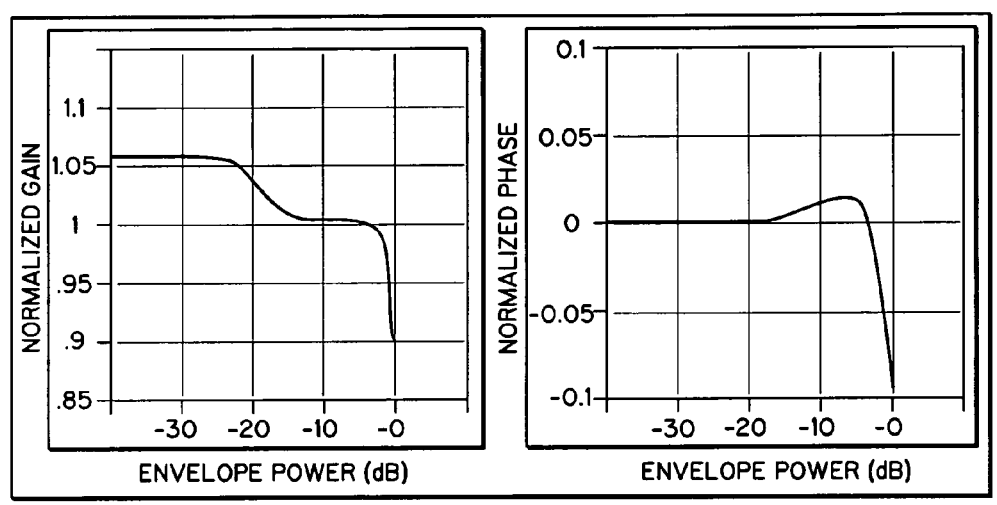
FIG. 1 is AM/AM (left side) and AM/PM (right side) distortion curves for an AB power amplifier operating in a UMTS band.

As noted above, digital predistortion techniques are utilized to address AM/AM and AM/PM distortion in an RF power amplifier. In a typical RF power amplifier, such as a class AB amplifier, conventional digital predistortion utilizing LUTs has been suitable. Generally, the shapes of the AM/AM and AM/PM distortion curves for a class AB amplifier are relatively stable over frequency variations and temperature variations. For example, referring to FIG. 1, on the left side, an AM/AM distortion curve is illustrated, whereas an AM/PM distortion curve is illustrated on the right side. Both such distortion curves are indicated for a class AB amplifier utilized in the UMTS band. The X-axis represents envelope power (in dB) relative to maximum envelope power. The Y-axis for the AM/AM plots on the left is the normalized gain expansion or compression of the amplifier on a linear scale. The Y-axis for the AM/PM plots on the right is the normalized phase expansion or compression of the amplifier on a linear scale. FIG. 1 illustrates data taken at a low operating frequency in the UMTS band of 2112.5 MHz. At a higher frequency of the UMTS band, or approximately 2167.5 MHz, the curves generally have the same shape as illustrated in FIG. 1 for the low frequency, and thus do not exhibit significant frequency dependence.

Figure 2:
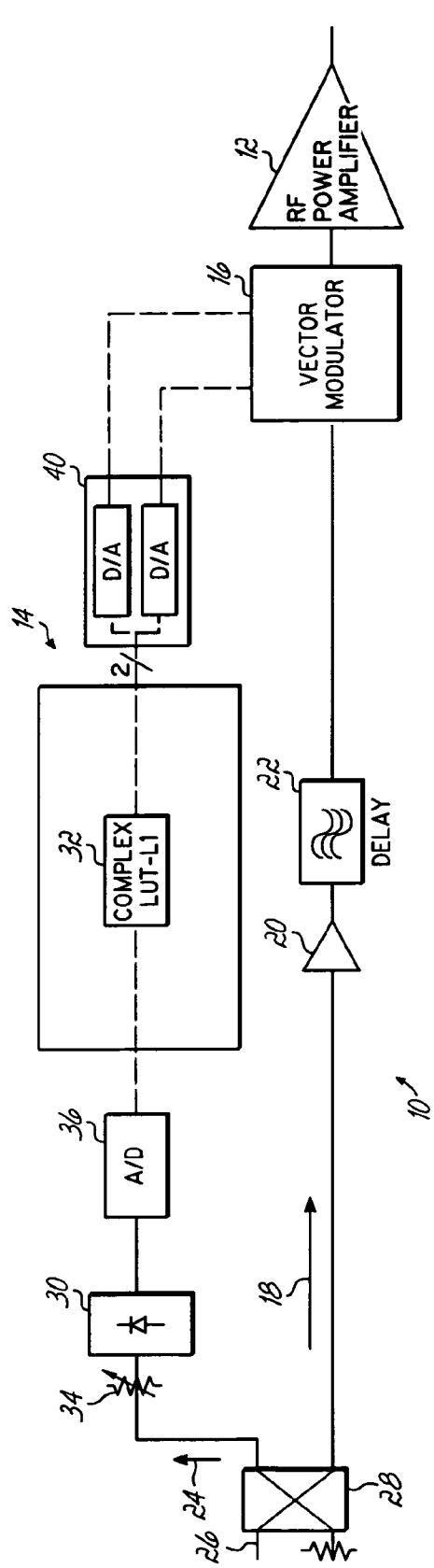
FIG. 2 is a block diagram of an amplifier design with predistortion features, showing Layer 1 predistortion.
Figure 3:
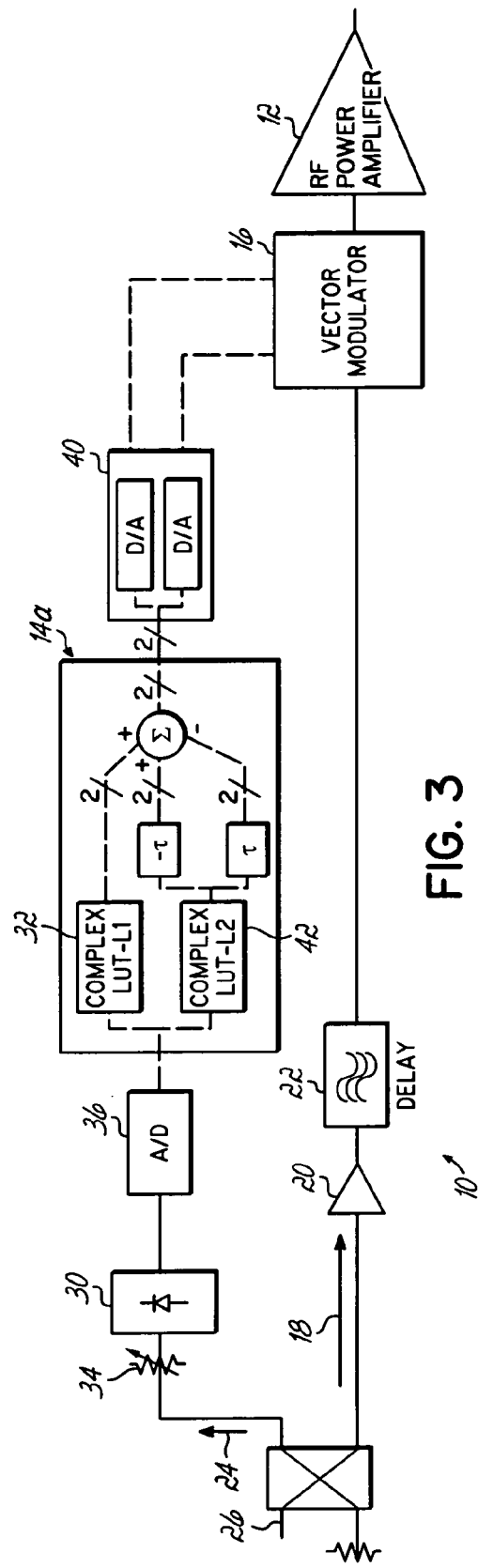
FIG. 3 is a block diagram of another amplifier design with predistortion features, showing Layer 1 and Layer 2 predistortion.

To address predistortion needs in such an AB amplifier, digital predistortion circuits similar to those illustrated in FIGS. 2 and 3 may be utilized. For example, the AM/AM and AM/PM distortion associated with nonlinearities in a power amplifier may be corrected by a predistortion circuit utilizing a single-layer or Layer 1 LUT, which is indexed by instantaneous envelope power. Specifically, referring to FIG. 2, amplifier 10 utilizes an RF power amplifier element 12, which is preceded by a digital predistortion circuit 14. The predistortion circuit 14 generates inputs to a vector modulator 16 that is located in the input signal path 18 to the RF power amplifier 12. As illustrated in FIG. 2, the input signal path 18 might include a preamplifier element 20 and a delay element 22 to offset the delay associated with the path 24 through the predistortion circuit 14. An RF input signal 26 is injected into the input signal path 18. A coupler or other suitable device 28 couples off a portion of the input signal 26 onto the predistortion path 24. An envelope detector 30 detects the level of the instantaneous envelope power of the input signal 26, which is then fed to a predistortion LUT 32. A variable attenuator element 34 might be coupled in the predistortion path 24 before the envelope detector 30 to vary the level of the input signal to the envelope detector. An A/D converter 36 converts the envelope voltage to a digital signal for indexing the complex LUT 32, which is designated in FIG. 2 as LUT-L1 to indicate that it is a "Layer 1" LUT.

Based upon the instantaneous envelope power, as determined by envelope detector 30, the LUT 32 is indexed and outputs a complex value signal pair (I&Q) that is then applied to the vector modulator 16 in accordance with known predistortion techniques. The two I and Q values are appropriately converted from the digital domain back to the analog domain by D/A converter 40 to be applied to the vector modulator. As is known in the art, the vector modulator is used to vary the magnitude and/or phase of the input signal in order to provide the desired predistortion of the input signal. While such predistortion can offer, for example, 10-15 dB of correction to the class AB amplifier, as noted above, utilization of such a predistortion module with a Doherty-type amplifier presents some issues that are not sufficiently addressed by the prior art, and prior attempts at predistortion.

FIG. 3 illustrates a somewhat similar predistortion amplifier design, wherein a second layer, or "Layer 2" predistortion model is utilized. Specifically, the predistortion circuit 14a incorporates a second layer complex LUT or LUT-L2 in order to address memory effects of the RF power amplifier. Such memory effects are generally a function of the time rate of change of the input signal's envelope. Such a predistortion circuit 14a utilizing a layer-1 LUT 32, as well as a layer-2 LUT 42 corrects for generally static AM/AM and AM/PM distortion products and memory effects associated with the RF power amplifier 12.

Figure 4:
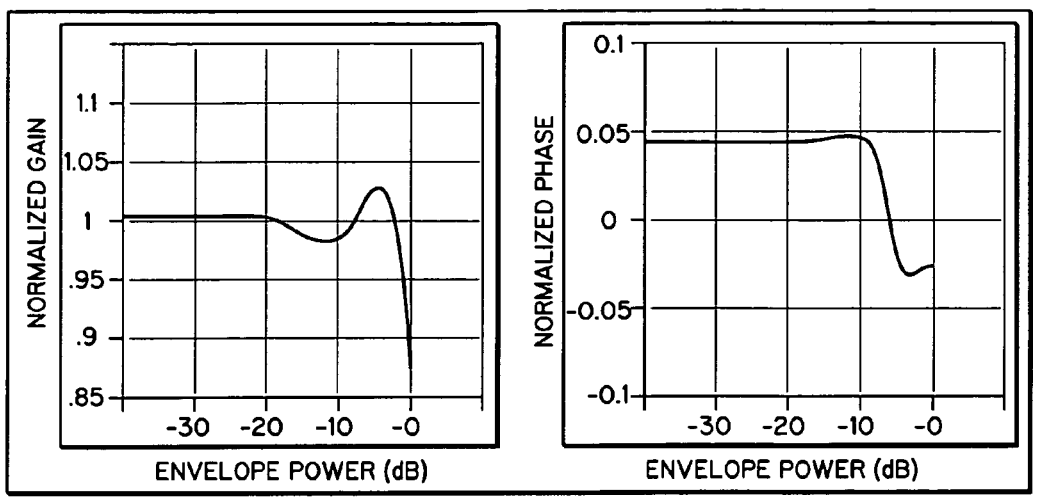
FIG. 4 is AM/AM (left side) and AM/PM (right side) distortion curves for a Doherty amplifier design in the PCS band at the lowest operating frequency in the PCS band.
Figure 5:
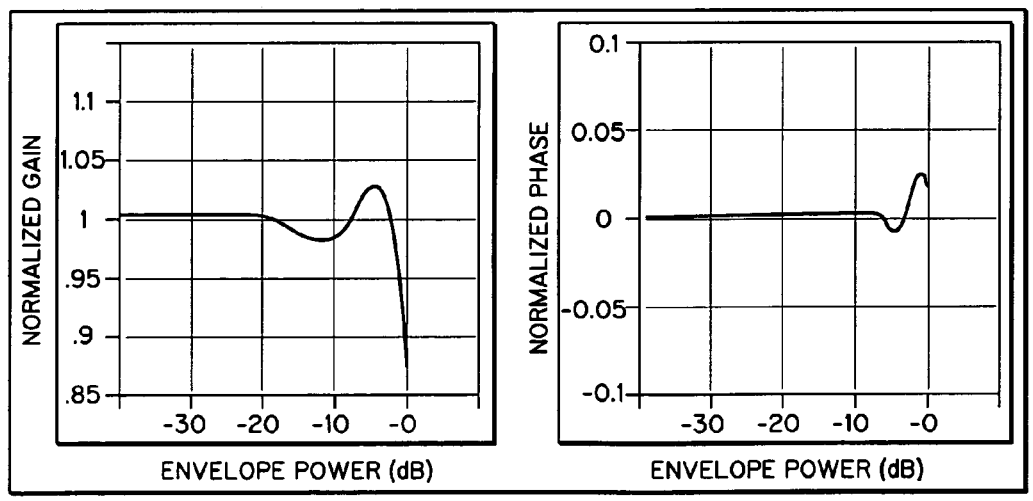
FIG. 5 is AM/AM (left side) and AM/PM (right side) distortion curves for a Doherty amplifier design in the PCS band at the highest operating frequency in the PCS band.

Referring now to FIGS. 4 and 5, AM/AM and AM/PM distortion curves are illustrated for a Doherty-type amplifier operating in the PCS band. FIG. 4 illustrates data taken at a lower operating frequency of 1932.5 MHz. FIG. 5, on the other hand, illustrates AM/AM and AM/PM distortion curves for the amplifier operating at the higher operating frequency of 1987.5 MHz of the PCS band. As shown in the Figures, while the AM/AM curves (left side) are similar in shape for the lower and higher frequencies, the AM/PM curves (right side) are considerably different. It is the difference in the AM/PM characteristic that presents the problem addressed by the present invention wherein the typical Layer-1 or Layer-1/Layer-2 predistortion models, as illustrated in FIGS. 2 and 3 are not suitable to address the AM/PM distortion characteristics of a Doherty amplifier design.

More specifically, the AM/PM curves for the Doherty-type amplifier change significantly with operating frequency. The inventors found that the manner in which the AM/PM curves vary with frequency is equivalent to group delay that is independent of frequency, but dependent on power level. As the input power to the Doherty-type amplifier is increased beyond the level required to turn on the peaking amplifier, the group delay through the amplifier decreases. This form of distortion observed in the Doherty-type amplifier is not significantly addressed by traditional predistortion designs as illustrated in FIGS. 2 and 3. Accordingly, it is addressed by the invention as set forth herein.

Review of the prior art as utilized for class AB amplifiers is helpful in illustrating that such existing predistortion models cannot adequately address or correct this group delay distortion term, which is indicated as a group delay that is a function of envelope power. Consideration of the aspects of the predistortion circuit and its operation are helpful in illustrating this point. First, consider a narrow band signal that starts at one envelope power, then ramps to a second envelope power, and then stays generally constant at the new, second envelope power for a period of time. During the two time periods when the envelope power is constant with respect to time, the values from Layer-2 LUTs 42 (FIG. 3) effectively cancel each other, resulting in only a Layer-1 correction of the amplitude and phase. Even if the Layer-2 LUTs are not equal in value at a given envelope power such that they would not cancel each other, for a time period of constant envelope power, the portion of the Layer-2 LUTs that does not cancel out is generally only equivalent to applying a fixed offset value to the Layer-1 LUT. If the same example is repeated at a second operating frequency, then a different phase solution is needed for the second frequency. However, only one layer-1 LUT (and one phase solution for each envelope power level) is available for all frequencies of operation within the operating bandwidth.

In another aspect, trying to create a delay shift by operating a phase shifter with a control signal that varies with time is also not adequately addressed by the prior art. In order to produce a delay shift, the time variation applied to the phase shifter must be proportional to the RF operating frequency of the signal, since group delay is indicated as the derivative of phase with respect to frequency. However, the envelope detector cannot sense the RF operating frequency of the signal, so such a solution is also expected to fail.

Figure 6:
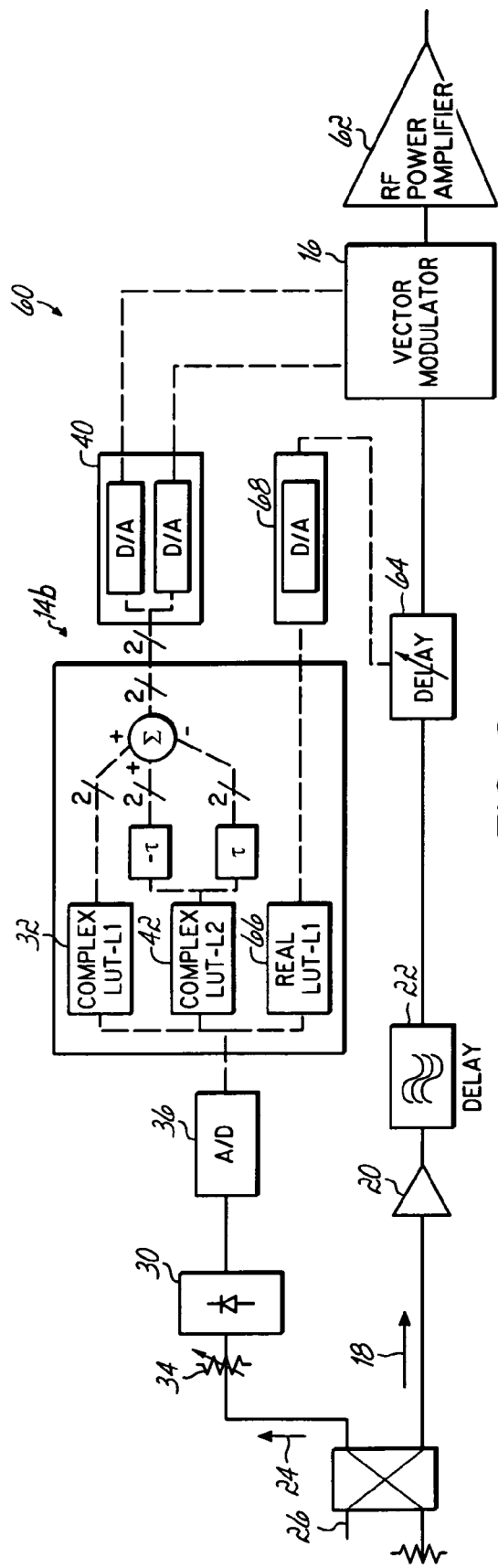
FIG. 6 is a block diagram of an amplifier design implementing an embodiment of the present invention.

In the present invention, the new distortion term is denoted as AM/DM distortion, which indicates group Delay Modulation that is a function of the Amplitude Modulation present in the signal. That is, in accordance with one aspect of the present invention, a predistorter is utilized, which addresses AM/AM distortion, AM/PM distortion, and AM/DM distortion. In one embodiment, as illustrated in FIG. 6, a Layer-1 correction term for the AM/DM distortion is provided, along with correction for typical AM/AM and AM/PM distortion. The embodiment of FIG. 6 addresses AM/AM and AM/PM distortion similar to the circuit design illustrated in FIG. 3 and thus, like elements utilize similar reference numerals in FIG. 6. The amplifier 60 of FIG. 6 utilizes an RF power amplifier 62. The RF power amplifier, indicated by reference numeral 62 and the symbol shown, is not limited to a single amplifier stage or a specific amplifier design. In the embodiment illustrated in FIG. 6, RF power amplifier 62 may be a Doherty-type amplifier. As understood by a person of ordinary skill in the art, a Doherty amplifier will generally utilize a main amplifier and a peak amplifier, although a single amplifier element is shown and referenced by numeral 62. As such, RF power amplifier 62 may be a suitable RF amplifier that experiences the group delay modulation distortion or the AM/DM distortion addressed by the invention.

Figure 7:
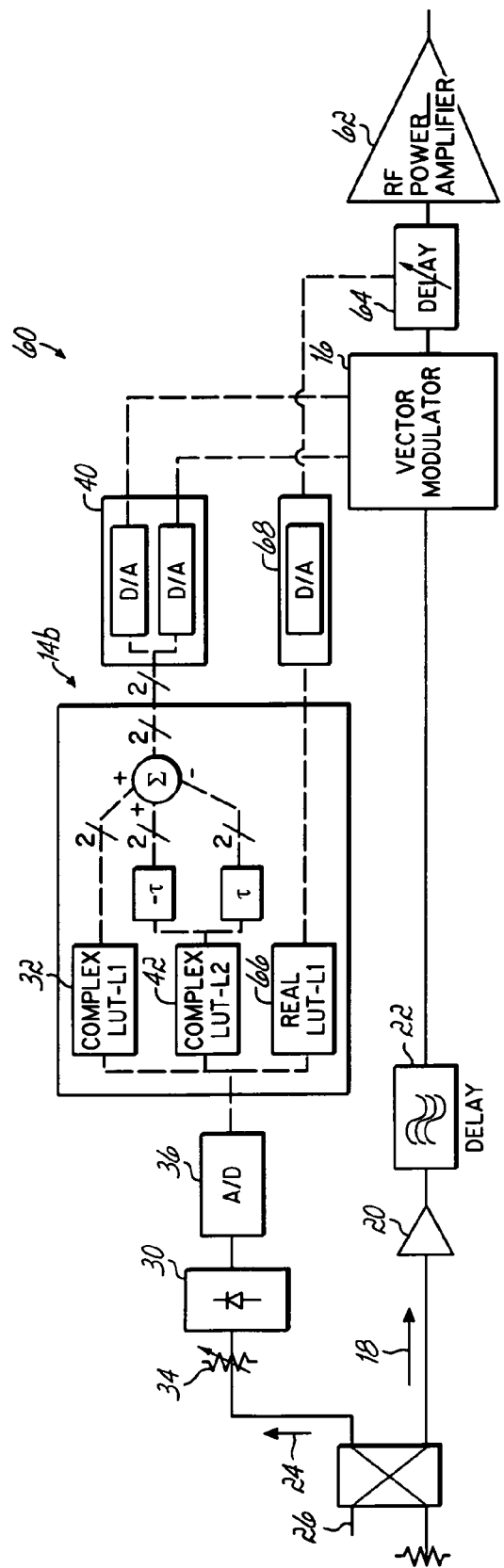
FIG. 7 is a block diagram of an amplifier design implementing another embodiment of the present invention.

In the input signal path 18 of the circuit, a variable RF delay shifter 64 is utilized. The RF delay shifter 64 is shown in FIG. 6 positioned in the input path prior to the vector modulator 16 and amplifier 62. However, in an alternative embodiment, as illustrated in FIG. 7, the RF delay shifter 64 is positioned after the vector modulator 16, but before the amplifier 62. The RF delay shifter 64 is driven with a scalar output of a LUT 66, which may be incorporated as part of the predistortion circuit. LUT 66 is indicated in FIG. 6 as Real LUT-L1 because its output is a real signal and not a complex signal as output by the LUTs 32, 42 that are utilized to address AM/AM and AM/PM distortion, as discussed above. LUT 66 is indexed by the instantaneous envelope power of the input signal, as provided by envelope detector 30. That is, based upon the instantaneous envelope power of the input signal 26, as determined by the envelope detector 30, the LUT is indexed and outputs a scalar value, which is utilized to drive the RF delay shifter 64. The digital output of LUT 66 is appropriately converted with D/A converter 68, to be utilized by the RF delay shifter 64. The delay shifter 64 presents a delay into the input path 18 for the input signal, which is a function of the amplitude modulation of the input signal. Such an introduced delay from the RF delay shifter 64 addresses the AM/DM distortion term noted above and provides a straightforward approach to correcting that AM/DM distortion within the RF power amplifier 62, such as a Doherty-type power amplifier design. In the embodiment of FIG. 6, the LUTs 32, 42 of the predistortion circuit 14B provide the Layer-1 and Layer-2 correction of the AM/AM and AM/PM terms for RF power amplifier 62. In that way, the linearity of the output signal of amplifier 60 is improved and addresses the various distortion factors associated with the amplifier.

Figure 8:
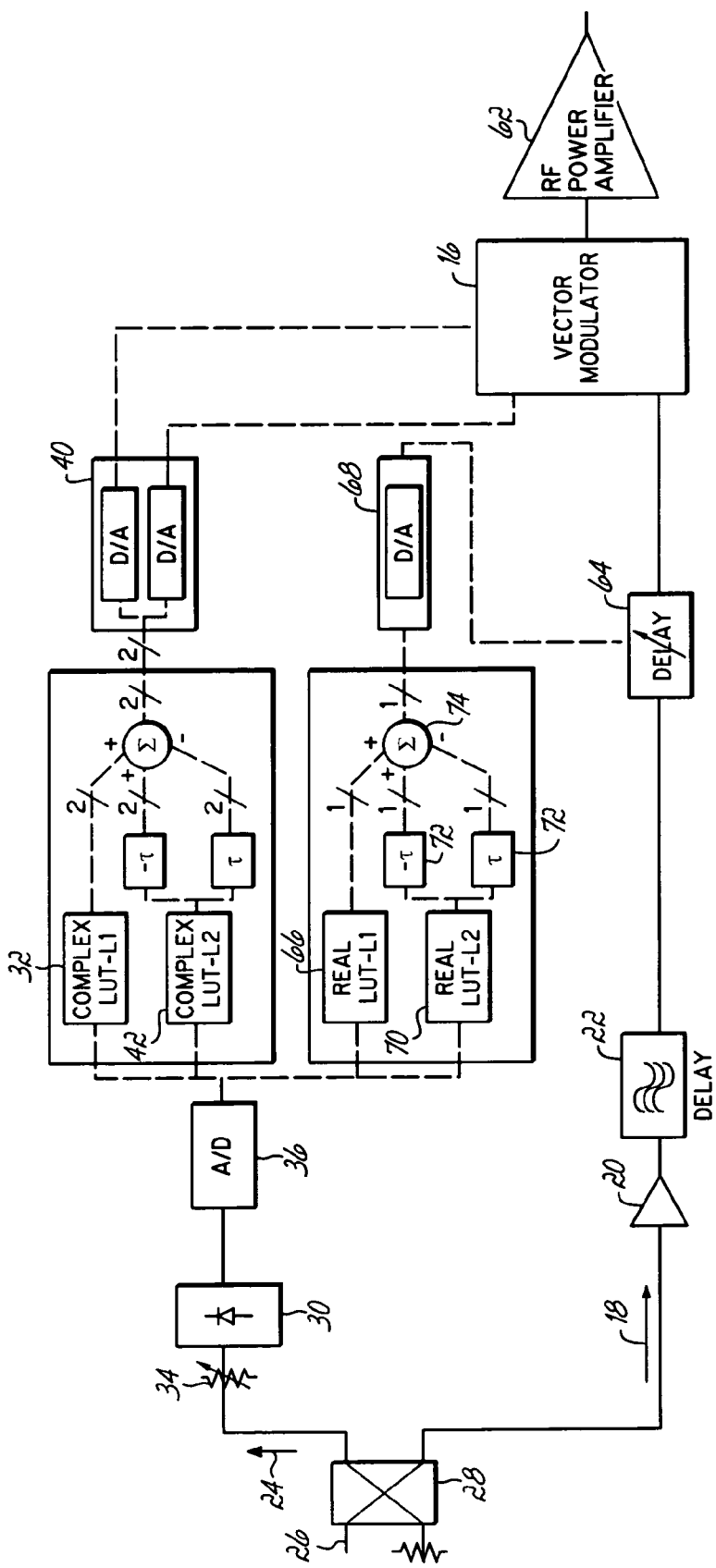
FIG. 8 is a block diagram of an amplifier design implementing another embodiment of the present invention.

FIG. 8 illustrates another embodiment of the invention utilizing a Layer-2 correction for the AM/DM distortion in the form of LUTs 70 and time delay elements 72. The additional LUTs 70 and associated time delay elements 72, provide an AM/DM distortion correction that addresses memory effects in the AM/DM distortion characteristic. Referring to FIG. 8, the scalar outputs from the LUTs 66, 70 are summed at appropriate summing circuitry 74 and converted to analog via D/A converter 68. The look up tables 66, 70 are indexed by the input signal 26 to the RF power amplifier. The outputs of the look up table 70 are time delayed or advanced from the outputs of the look up table 66 as shown in FIG. 8 and similar to such time delays/advances as utilized in the circuits of FIGS. 3, 6-9. The input to the RF delay shifter 64 provides a correction of the AM/DM term via a Layer-1 and Layer-2 predistortion model that provides real scalar outputs to control the RF delay shifter 64. FIG. 8 also illustrates utilization of the RF delay shifter prior to the vector modulator 16. Of course as noted above, and shown in FIG. 9, the RF delay shifter may be positioned after the vector modulator 16 and prior to amplifier 62 in the input path 18.

Figure 10:
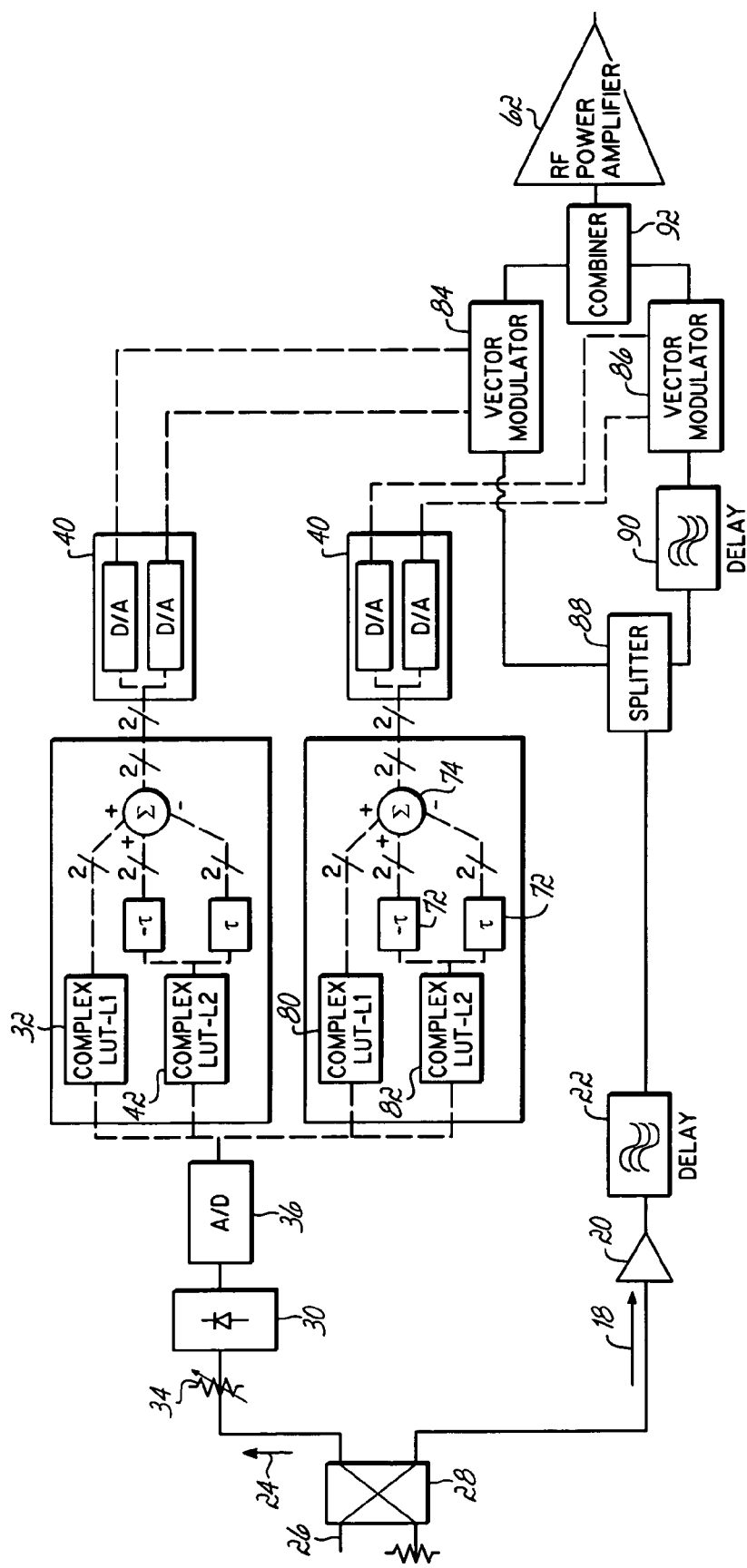
FIG. 10 is a block diagram of an amplifier design implementing another embodiment of the present invention.

FIG. 10 illustrates another alternative embodiment of the invention wherein AM/DM distortion is addressed, utilizing multiple vector modulators and multiple paths. In the embodiment of FIG. 10, the AM/AM and AM/PM distortion is also addressed by the vector modulators in addition to AM/DM. By varying the appropriate distribution of the pre-distortion coefficients from the LUTs 32, 42 and 80, 82, which are used for the vector modulators, the amount of delay shift that is applied to the input signal 18 may be varied. In doing so, the desirable variable delay shift in accordance with one aspect of the invention is achieved.

More specifically, referring to FIG. 10, rather than implementing a single vector modulator to address AM/AM and AM/PM distortion and a variable delay element 64, which is addressed by LUTs having real values to handle AM/DM distortion, the embodiment of FIG. 10 utilizes two vector modulators 84, 86. Each of those vector modulators is coupled with an appropriate predistortion circuit that provides the desired predistortion values to address not only the AM/AM and AM/PM predistortion, but also to implement a variable delay shift for the input signal, prior to the RF power amplifier 62. Specifically, vector modulator 84 is coupled to complex LUTs 32, 42. Vector modulator 86 is coupled to complex LUTs 80, 82. Input signal 18 is split by an appropriate in-phase splitter or coupler circuit 88 between the two vector modulators 84, 86. In one of the paths, specifically the path of vector modulator 86 in FIG. 10, a delay element 90, such as a fixed delay, is utilized. The output to the vector modulator is then summed by an appropriate in-phase combiner or coupler circuit 92 and then provided to the RF power amplifier 62. Therefore, the variable delay element 64, such as that illustrated in FIG. 6, is removed and a fixed delay element in combination with two vector modulator paths, is utilized to provide the variable delay in accordance with one aspect of the invention.

Figure 11:
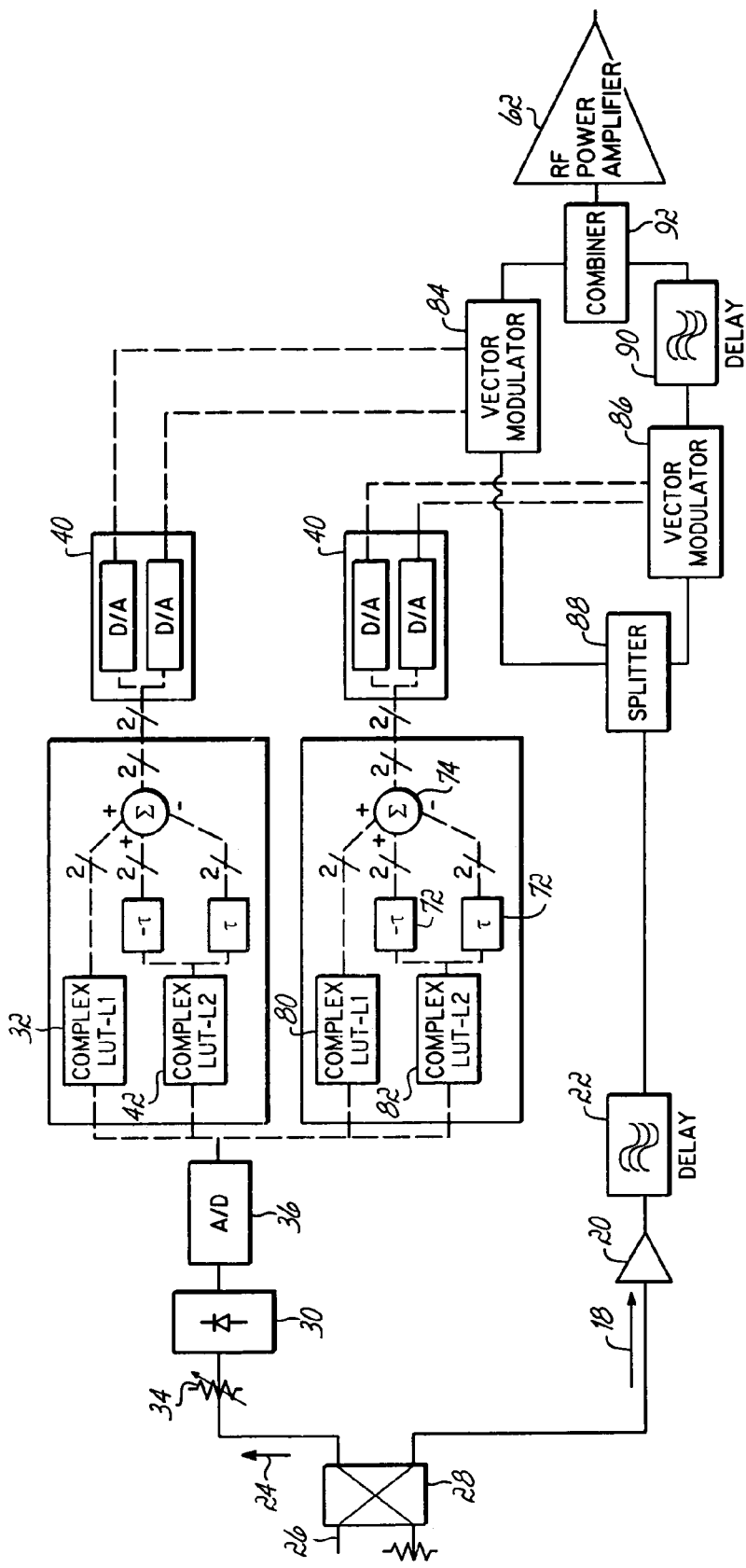
FIG. 11 is a block diagram of an amplifier design implementing another embodiment of the present invention.

As will be readily understood by a person of ordinary skill in the art, by utilizing appropriate values between the vector modulators 84 and 86, the amount of signal affected by each path may be varied. In that way, the delay provided by element 90 in the path of vector modulator 86 and its effect on the overall composite signal coming from combiner 92 may be varied. Therefore, the amount of delay shift applied to the input signal 18 may be controlled as desired. For example, if the LUTs 80, 82 contain values that correspond to maximum attenuation in the vector modulator 86 and the LUTs 32 and 42 have the appropriate predistortion coefficients, the operation of FIG. 10 would essentially be somewhat similar to that shown in FIG. 3, as the appropriate delay from element 90 would generally not be realized. Alternatively, if the LUTs 32 and 42 are loaded with values that correspond to maximum attenuation in the vector modulator 84, the LUTs 80 and 82, having the proper predistortion coefficients, would generally provide the delay to the input signal implemented by delay element 90. With the appropriate distribution of the predistortion coefficients between the sets of LUTs and the vector modulators 84, 86, the variable delay is provided in the input path as desired. While FIG. 10 illustrates the delay element 90 utilized before the vector modulator 86, it might also be utilized after the vector modulator as shown in FIG. 11.

Figure 12:
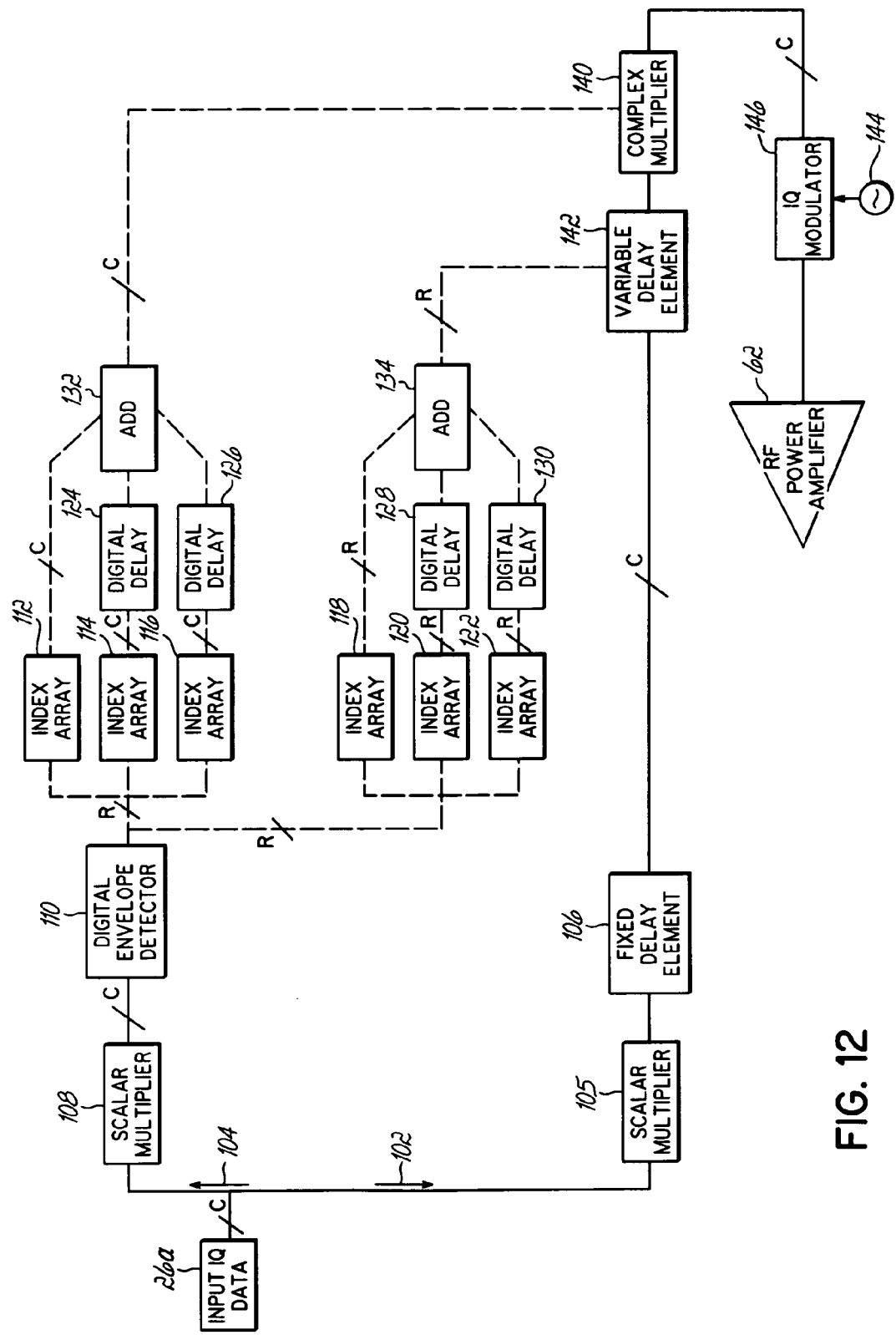
FIG. 12 is a block diagram of an amplifier design implementing digital embodiment of the present invention.

FIG. 12 illustrates another alternative embodiment of the invention wherein embodiments of the invention are implemented in the digital domain. Specifically, the variable delay to be introduced in accordance with the principles of the present invention to address AM/DM distortion is handled at the baseband. Primarily, the input signal 26a is implemented as a stream of baseband data, for example, I and Q values. The I/Q data can then be utilized to modulate an RF carrier to ultimately create the input signal 26, as illustrated in FIG. 8, for example. FIG. 12 illustrates an embodiment somewhat similar to the embodiment of FIG. 8, except in the baseband version. For example, the input data 26a is multiplexed or split along data paths 102, 104. The input signal data 102 proceeds along a main path, where it may be multiplied such as by a scalar multiplier 105 to simulate the amplification of element 20. A fixed delay element 106, such as a shift register, or a filter structure (e.g., FIR or IIR filter) provides a delay of the main data 102 to the RF amplifier 62. Data 104 proceeds through an appropriate multiplier element 108, such as a scalar multiplier, which may be utilized to appropriately adjust or scale the input data 26*a*. An appropriate envelope detector 110, such as a digital envelope detector, may be utilized and provides the operation of deriving the square root of the sum of the I values squared and the Q values squared. Any scaling of the value of envelope detector provided by multiplier 108 can be used to index multiple arrays or LUTs stored in memory. For example, index arrays 112, 114 and 116 may be utilized with appropriate digital delay elements 124, 126 (e.g., shift registers) and adder 132, to control a complex multiplier 140 to address AM/AM and AM/PM distortion. Another set of index arrays or LUTs 118, 120, 122, along with appropriate delay elements 128, 130, and adder 134, may be utilized to control a variable delay element 142, as discussed above, to address AM/DM distortion. Utilizing the inputs from adder 132 and variable delay element 142, the complex multiplier addresses the various distortion components and provides output I/Q data. The variable delay element may be a shift register, filter structure, or other appropriate digital delay element that may contain variable coefficients. The output I/Q data is fed to an I/Q modulator 146, which includes an RF carrier generator 144 that is utilized to modulate an RF carrier and, thus, create an RF signal that is then amplified by RF amplifier 62. In that way, variable delay may be introduced to address the AM/DM distortion as described herein.

Figure 9:
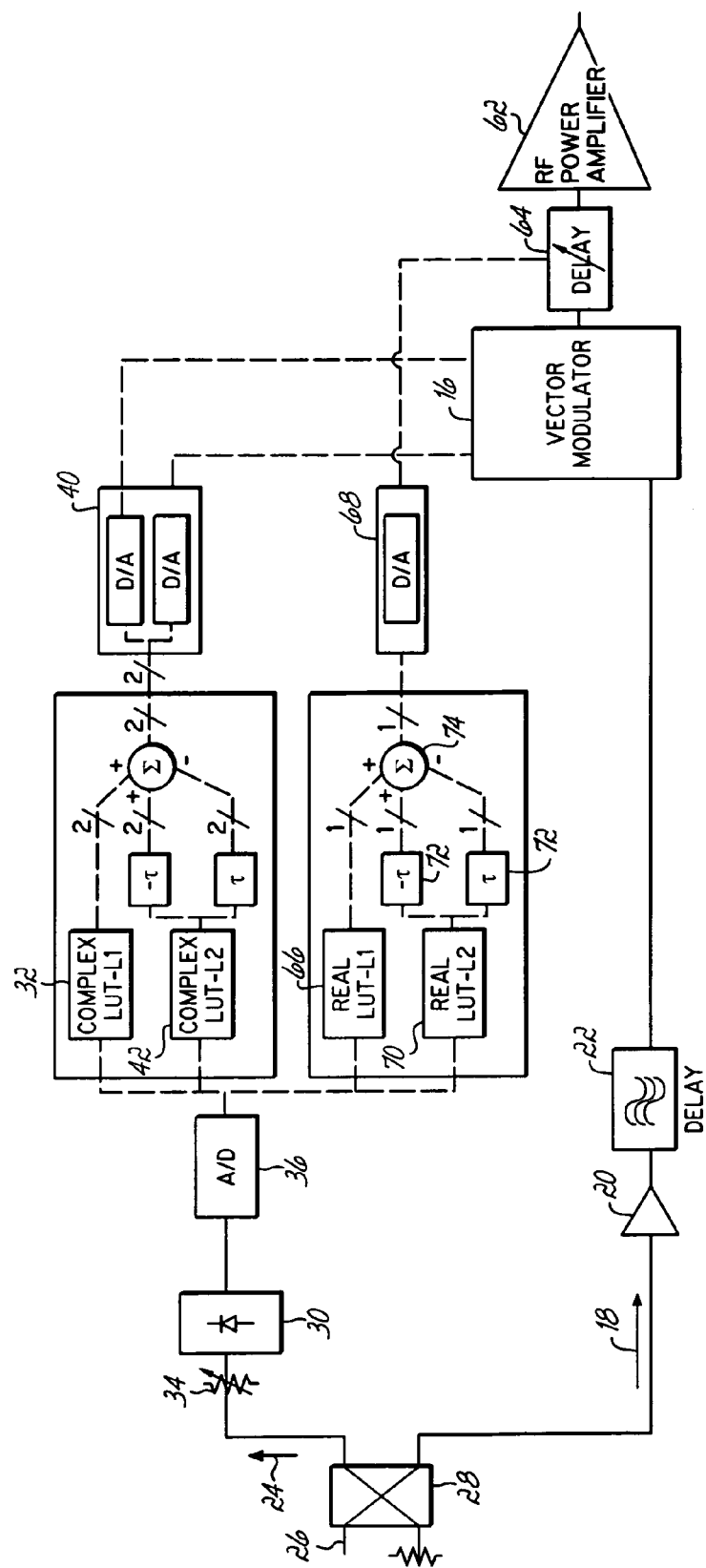
FIG. 9 is a block diagram of an amplifier design implementing another embodiment of the present invention.
Figure 13:
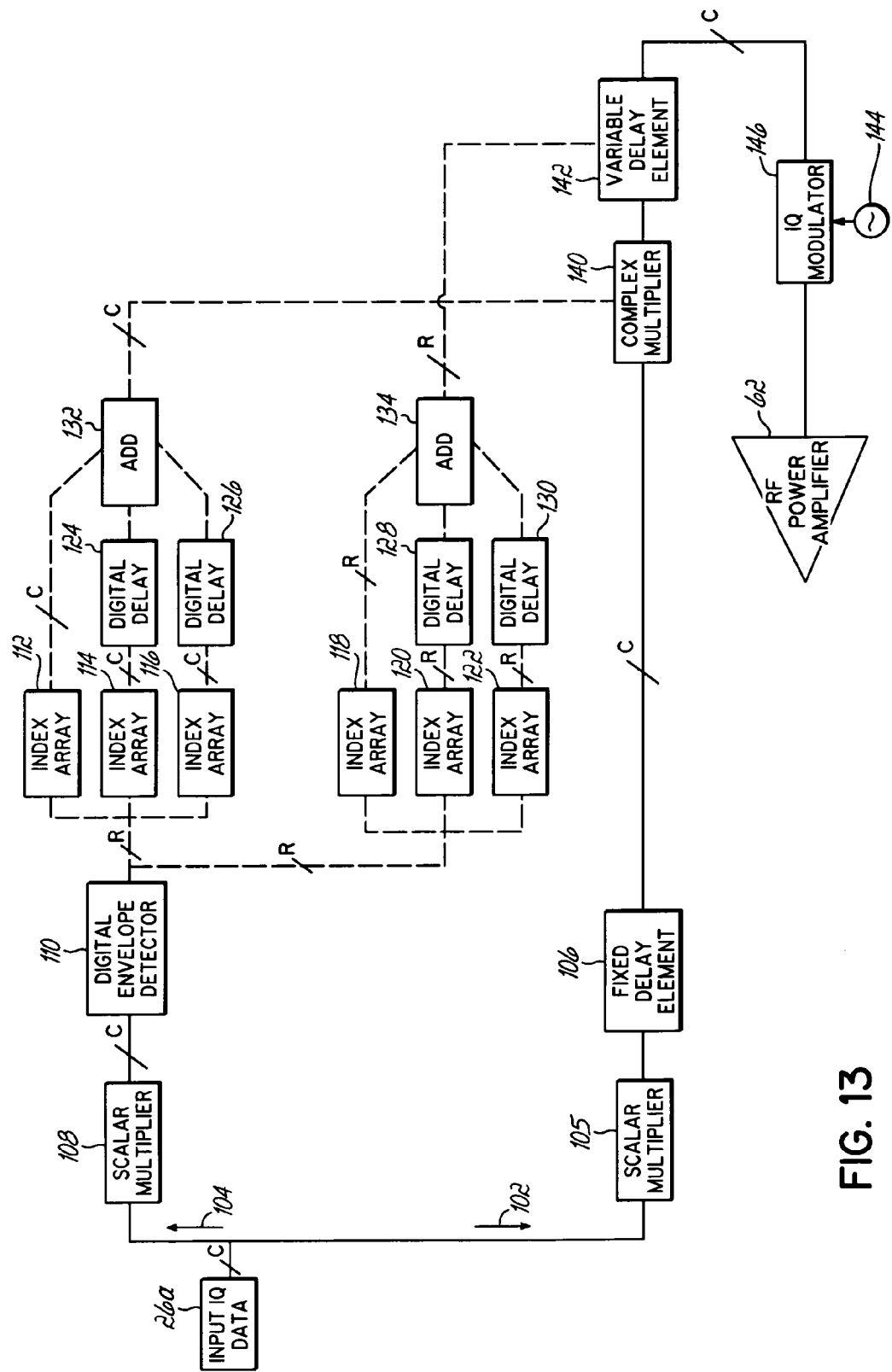
FIG. 13 is a block diagram of an amplifier design implementing another digital embodiment of the present invention.

FIG. 13 illustrates another alternative embodiment of the invention in baseband, and somewhat similar to FIG. 9. That is, the variable delay element 142 is positioned after the complex multiplier 140.

Figure 14:
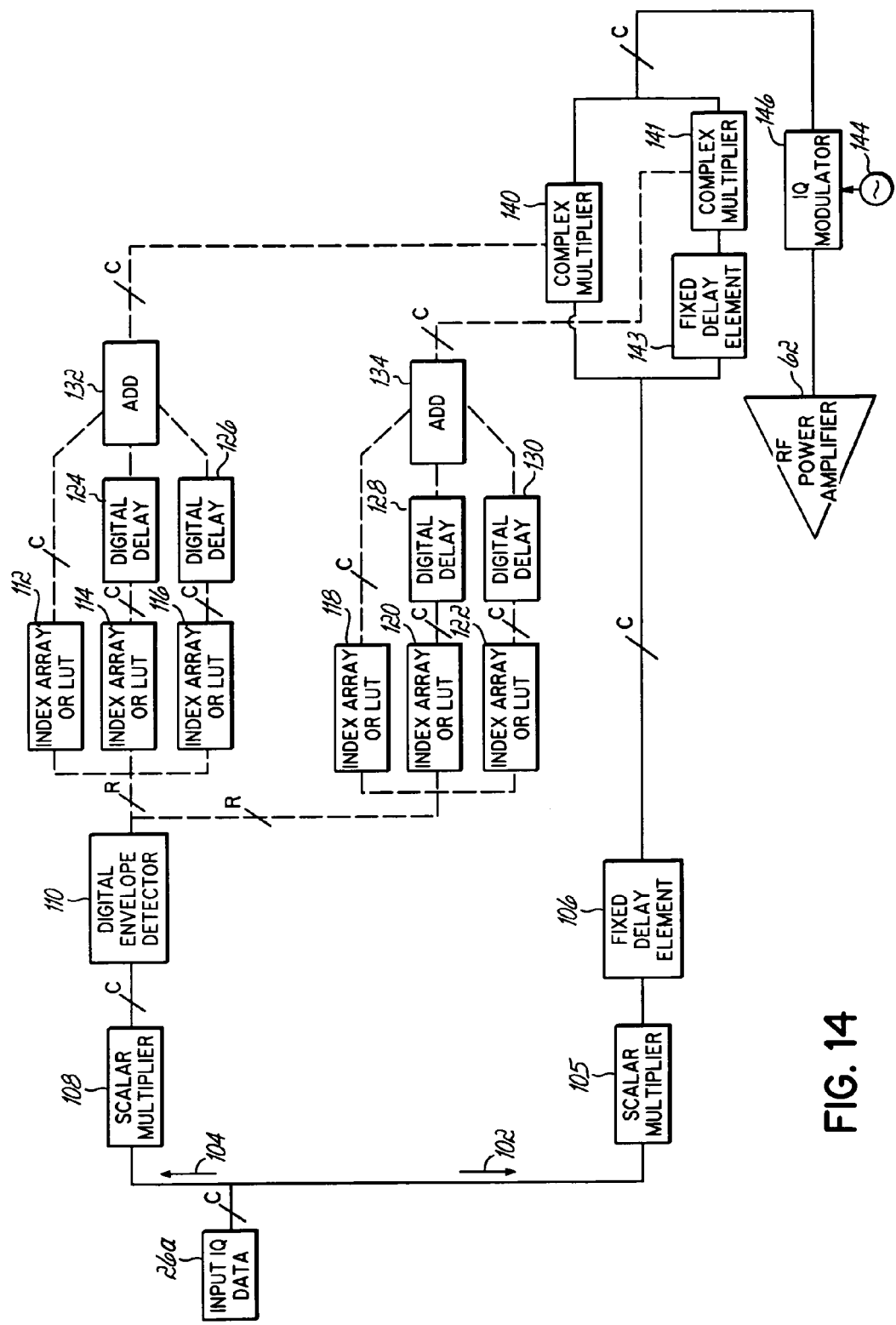
FIG. 14 is a block diagram of an amplifier design implementing another digital embodiment of the present invention.
Figure 15:
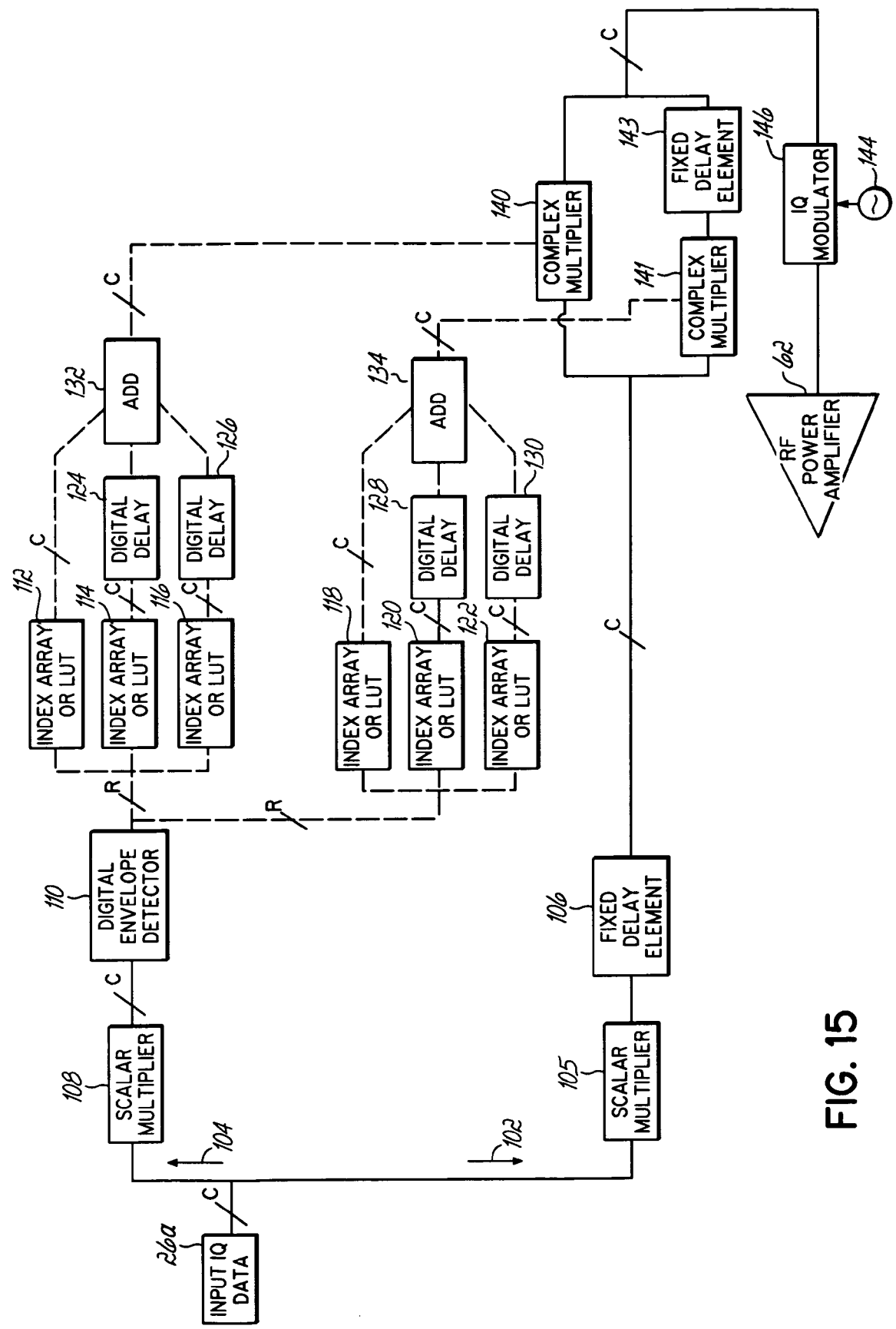
FIG. 15 is a block diagram of an amplifier design implementing another digital embodiment of the present invention.

FIGS. 14 and 15 illustrate still other embodiments of the invention in the digital domain. Specifically, FIG. 14 is the baseband equivalent to FIG. 10 while FIG. 15 is the baseband equivalent of FIG. 11. Similar reference numerals are used as in FIGS. 12 and 13 where applicable for these digital embodiments.

Both FIGS. 14 and 15 utilize the equivalent to a pair of vector modulators is shown in FIGS. 10 and 11. In the digital version, complex multiplier 140 is used in one path and complex multiplier 141 is used in a parallel path along with a fixed delay element 143 before the complex multiplier. FIG. 15 shows a similar embodiment as FIG. 14 except with the fixed delay element after the complex multiplier 141 in the path.

Therefore, the present invention addresses the three forms of distortion created in a Doherty-type amplifier. It specifically addresses the AM/DM distortion terms in such Doherty-type amplifiers that are believed to be more prominent than in a class AB amplifier. The present invention corrects the AM/DM distortion, which allows for better correction of the AM/AM and AM/PM distortion terms in a Doherty-type amplifier. Furthermore, the invention addresses the memory components of any AM/DM distortion.

While the present invention has been illustrated by a description of various embodiments and while these embodiments have been described in considerable detail, it is not the intention of the applicant to restrict or in any way limit the scope of the appended claims to such detail. Additional advantages and modifications will readily appear to those skilled in the art. The invention in its broader aspects is therefore not limited to the specific details, representative apparatus and method, and illustrative examples shown and described. Accordingly, departures may be made from such details without departing from the spirit or scope of applicant's general inventive concept.

What is claimed:

1. An amplifier circuit comprising: an RF power amplifier; an RF delay shifter positioned in an input signal path to the RF power amplifier to generate a delay in the input signal path; predistortion circuitry coupled with the power amplifier to affect the input signal path of an RF input signal to the power amplifier, the predistortion circuitry including at least one look up table or index array coupled to the delay shifter, the predistortion circuitry operable for detecting a level of an input signal and indexing the at least one look up table or index array with the detected input signal level to generate a control signal to directly control the delay shifter for varying the amount of delay in the input signal path based on the input signal level.

2. The amplifier circuit of claim 1 further comprising a vector modulator coupled in the input signal path prior to the RF power amplifier, the predistortion circuitry generating inputs to the vector modulator for predistorting the RF input signal to the RF power amplifier.

3. The amplifier circuit of claim 2 wherein the predistortion circuitry includes lookup tables indexed by the input signal level, the lookup tables generating inputs to the vector modulator for predistorting the RF input signal to the RF power amplifier.

4. The amplifier circuit of claim 3 wherein the lookup tables include at least one lookup table for correcting for non-linearities in the RF power amplifier and at least one other lookup table for correcting for memory effects of the RF power amplifier.

5. The amplifier circuit of claim 2 wherein the delay is generated in the input path before the vector modulator.

6. The amplifier circuit of claim 2 wherein the delay is generated in the input path after the vector modulator.

7. The amplifier circuit of claim 1 further including at least a pair of look up tables indexed by the input signal to the RF power amplifier, wherein the output of one look up table is time delayed or advanced from the outputs of the other look up table and the outputs of the other look up table and the outputs of the look up table are combined.

8. A method of amplifying an RF signal comprising: in an input signal path to an RF amplifier, introducing a variable delay with a delay shifter; providing predistortion of an input signal in the input signal path to the RF amplifier using predistortion circuitry, the predistortion circuitry including at least one look up table or index array coupled to the delay shifter; detecting the level of the input signal and indexing the at least one look up table or index array with the detected input signal level to generate a control signal that is provided to the delay shifter to directly control the delay shifter for selectively varying the introduced delay based upon the input signal level.

9. The method of claim 8 further comprising detecting the level of the input signal with an envelope detector.

10. The method of claim 8 wherein the predistortion of the input signal is applied using a vector modulator.

11. The method of claim 10 further comprising introducing the delay in the input signal path before the vector modulator.

12. The method of claim 10 further comprising introducing the delay in the input signal path after the vector modulator.

13. The method of claim 8 further comprising selectively varying the delay using a pair of lookup tables indexed by the input signal level, wherein the output of one look up table is time delayed or advanced from the outputs of the other look up table and the outputs of the look up tables are combined.

14. The method of claim 8 wherein the predistortion circuitry provides correction for non-linearities in the RF power amplifier and for memory effects of the RF power amplifier.

15. An amplifier circuit comprising:
an RF power amplifier;
digital predistortion circuitry coupled with the power amplifier to affect an input path of input signal data associated with an input signal to the power amplifier;
the digital predistortion circuitry including at least one look up table or index array and operable for detecting a digital envelope level of the input signal data and indexing the at least one look up table or index array with the detected digital envelope level to generate a control signal to drive and directly control a delay shifter for varying an amount of digital delay introduced into the input path based on the input signal data level;
a baseband modulator for generating an RF signal from the input signal data.

16. The amplifier circuit of claim 15 further comprising a complex multiplier coupled in the input path prior to the RF power amplifier; the predistortion circuitry generating inputs to the complex multiplier for predistorting the input signal data.

17. The amplifier circuit of claim 16 wherein the predistortion circuitry includes arrays indexed by the envelope level, the arrays generating inputs to the complex multiplier for predistorting the input signal data.

18. The amplifier circuit of claim 16 wherein the delay is generated in the input path before the complex multiplier.

19. The amplifier circuit of claim 16 wherein the delay is generated in the input path after the complex multiplier.

20. An amplifier circuit comprising:
an RF power amplifier;
a pair of signal-modifying circuits coupled in parallel in an input path prior to the RF power amplifier to receive an input signal and provide multiple paths for portions of the input signal, the multiple paths collectively outputting a composite signal to input to the RF amplifier;
a delay element positioned in serial in a path with at least one of the signal-modifying circuits;
predistortion circuitry operable for providing inputs to the signal-modifying circuits and based on the level of the input signal varying the values the inputs to the signal-modifying circuits in the multiple paths to vary the attenuation of the input signal portion in the path with the delay element and thereby vary the effect of the delay element path on the respective portion of the input signal to provide direct control of a variable delay in the composite signal that is input to the RF amplifier.

21. The amplifier circuit of claim 20 wherein the signal-modifying circuits are vector modulators and the predistortion circuitry generates inputs to the vector modulators for predistorting the input signal.

22. The amplifier circuit of claim 21 wherein the predistortion circuitry includes lookup tables indexed by the input signal level, the lookup tables generating inputs to the vector modulators for predistorting the input.

23. The amplifier circuit of claim 22 wherein the lookup table is indexed by the input signal level.

24. The amplifier circuit of claim 20 wherein the delay element is positioned in serial before the at least one signal-modifying circuit.

25. The amplifier circuit of claim 20 wherein the delay element is positioned in serial after the at least one signal-modifying circuit.

26. The amplifier circuit of claim 20 wherein the signal-modifying circuits are complex multipliers.

27. A method of amplifying an RF signal comprising:
directing an input signal in an input path to a pair of signal-modifying circuits coupled in parallel in the input path to provide multiple paths for portions of the input signal;
combining the outputs of the signal-modifying circuits of the multiple paths to output a composite signal to input to the RF amplifier;
positioning a delay element in serial in a path with at least one of the signal-modifying circuits;
providing inputs to the signal-modifying circuits with predistortion circuitry and based on the level of the input signal varying the values of the inputs to the signal-modifying circuits in the multiple paths to vary the attenuation of the input signal in the path with the delay element and thereby vary the effect of the delay element path on the respective portion of the input signal to provide direct control of a variable delay in the composite signal that is input to the RF amplifier.

28. The method of claim 27 wherein the signal-modifying circuits are vector modulators and further comprising generating inputs to the vector modulators with the predistortion circuitry for predistorting the input signal.

29. The method of claim 28 wherein the predistortion circuitry includes lookup tables indexed by the input signal level, the lookup tables generating inputs to the vector modulators for predistorting the input.

30. The method of claim 29 wherein the lookup table is indexed by the input signal level.

31. The method of claim 27 wherein the delay element is positioned in serial before the at least one signal-modifying circuit.

32. The method of claim 27 wherein the delay element is positioned in serial after the at least one signal-modifying circuit.

33. The method of claim 27 wherein the signal-modifying circuits are complex multipliers.

* * * * *